(12) United States Patent
Nam et al.

(10) Patent No.: US 10,996,694 B2
(45) Date of Patent: May 4, 2021

(54) REGULATORS WITH OFFSET VOLTAGE CANCELLATION

(71) Applicant: MICRON TECHNOLOGY, INC., Boise, ID (US)

(72) Inventors: Ki-Jun Nam, Boise, ID (US); John David Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/448,162

(22) Filed: Jun. 21, 2019

(65) Prior Publication Data

US 2020/0401166 A1    Dec. 24, 2020

(51) Int. Cl.
| | | |
|---|---|---|
| G05F 1/44 | (2006.01) | |
| H02M 7/537 | (2006.01) | |
| H02M 1/00 | (2006.01) | |
| H03F 3/45 | (2006.01) | |
| H03M 1/10 | (2006.01) | |

(52) U.S. Cl.
CPC .............. *G05F 1/44* (2013.01); *H02M 7/537* (2013.01); *H02M 2001/0067* (2013.01); *H03F 3/45995* (2013.01); *H03M 1/1028* (2013.01)

(58) Field of Classification Search
CPC . G05F 1/44; H02M 7/537; H02M 2001/0067; H03M 1/1028; H03M 1/1019; H03M 1/1023; H03M 1/1014; H03F 3/45995
See application file for complete search history.

(56) References Cited

U.S. PATENT DOCUMENTS

| | | | | |
|---|---|---|---|---|
| 5,789,974 | A * | 8/1998 | Ferguson, Jr. | ...... H03F 3/45968 330/2 |
| 8,710,819 | B2 * | 4/2014 | Chen | ....................... G05F 1/561 323/285 |
| 2006/0176052 | A1 | 8/2006 | Seo | |
| 2009/0243571 | A1 * | 10/2009 | Cook | ...................... G05F 1/575 323/280 |
| 2011/0283060 | A1 * | 11/2011 | Ware | ..................... G06F 3/0629 711/106 |

* cited by examiner

*Primary Examiner* — Kyle J Moody
*Assistant Examiner* — Jye-June Lee
(74) *Attorney, Agent, or Firm* — Dicke, Billig & Czaja, PLLC

(57) ABSTRACT

A regulator includes an operational amplifier, a programmable offset voltage, and a circuit. The operational amplifier includes a non-inverting input, an inverting input, and an output. The programmable offset voltage is configured to cancel a built-in offset voltage of the regulator based on a code. The circuit is configured to set the code based on a sensed built-in offset voltage of the regulator in response to an offset cancellation calibration mode enable signal.

22 Claims, 11 Drawing Sheets

REGULATORS WITH OFFSET VOLTAGE CANCELLATION

TECHNICAL FIELD

The present disclosure relates generally to voltage regulators and, in particular, in one or more embodiments, the present disclosure relates to apparatus and methods for cancelling random built-in offset voltages in voltage regulators.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, tablet computers, digital cameras, digital media players, cellular telephones, solid state drives and removable memory modules, and the uses are growing.

Memory devices may have internal voltage supplies that vary due to random variation and process variation of a reference voltage. This die to die variation may be compensated for by fuse trimming of the reference voltage. Random local threshold voltage (Vt) variation in a regulator may also cause internal supply voltage variation and may also be compensated for by using trimming. Typically, the regulator trimming is performed during probe testing with dedicated test and fuse bits. The trimming may be performed during either CPP (cold temperature probe) or FPP (hot temperature probe). The trimming during probe testing may compensate for die to die reference voltage variations and random local Vt variations for a regulator. Since the probe test is performed at a specific temperature, however, the trimmed internal supply may be most accurate at that specific temperature. If trimming is performed at CPP, the internal voltage supply may be most accurate at the specific cold temperature used for CPP. If the trimming is performed at FPP, the internal voltage supply may be most accurate at the specific hot temperature used for FPP. This method of trimming cannot compensate for local temperature dependent Vt variation. Local Vt variation is systematic but has a small random component dependent on temperature and may change in an unpredictable way based on the temperature. The random local variation at cold temperature may be larger than at hot temperature. As a result, a uniform voltage distribution at a first temperature after trimming may diverge into a normal voltage distribution at a second temperature different from the first temperature. This diverging into a normal voltage distribution may hurt the performance of devices that are sensitive to variations of the internal voltage supply.

For the reasons stated above, and for other reasons stated below which will become apparent to those skilled in the art upon reading and understanding the present specification, there is a need in the art for alternative methods for cancelling random built-in offset voltage in voltage regulators.

DETAILED DESCRIPTION

Figure 1A:
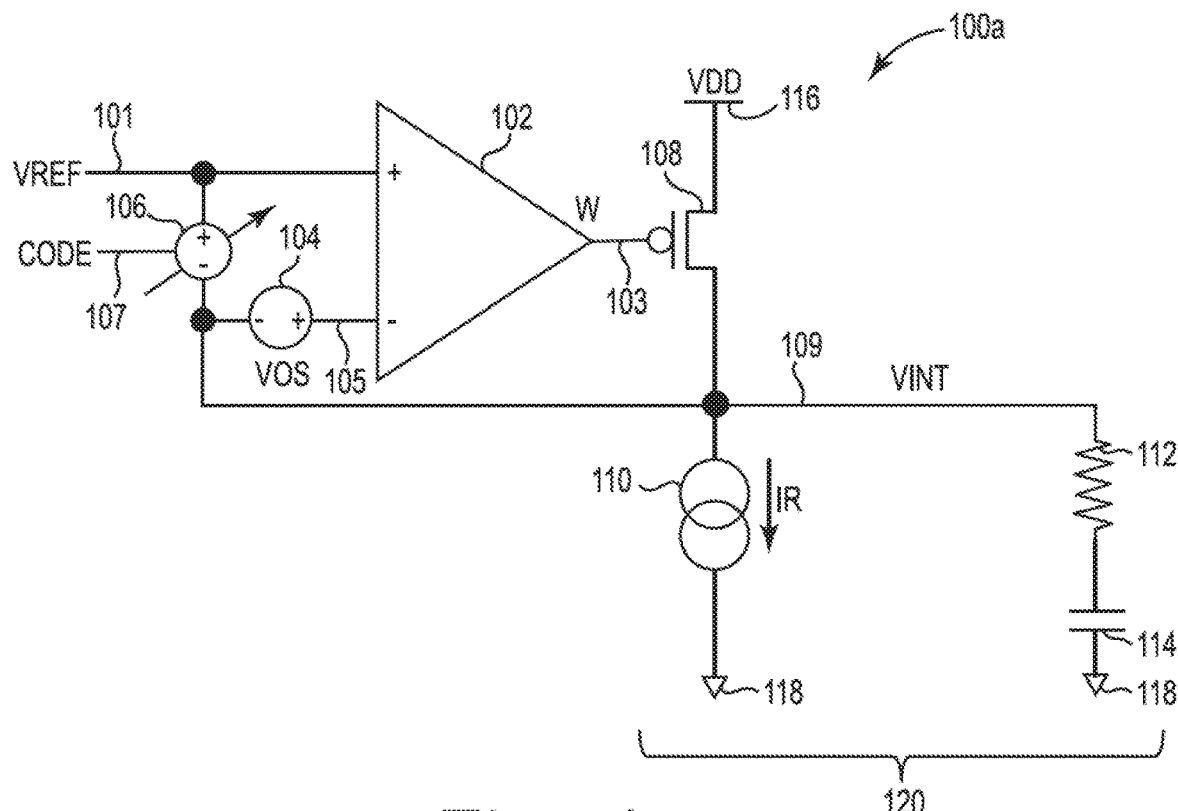
FIG. 1A is a schematic diagram illustrating one example of a voltage regulator during an operating mode.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

As used herein a "logic high" signal is a logic "1" or "on" signal or a signal having a voltage about equal to the logic power of a semiconductor die. As used herein a "logic low" signal is a logic "0" or "off" signal or a signal having a voltage about equal to a logic power common or ground of the semiconductor die (e.g., about 0 V).

Disclosed herein are apparatus and methods for cancelling a built-in offset voltage in a voltage regulator. A polarity and/or a magnitude of the built-in offset voltage may be random. The built-in offset voltage may be dependent upon temperature and may vary from die to die. Accordingly, apparatus and methods are disclosed for automatic offset voltage cancellation in regulators to compensate for temperature dependent offset voltage drift. The automatic offset voltage cancellation is implemented by periodically detecting the built-in offset voltage and adjusting a programmable offset voltage to cancel the built-in offset voltage.

FIG. 1A is a schematic diagram illustrating one example of a voltage regulator 100a during an operating mode. Voltage regulator 100a may include an operational amplifier 102, a programmable offset voltage 106, a first transistor (e.g., pFET) 108, a first bias current (e.g., a first current source) 110, a resistance 112, and a capacitance 114. Regulator 100a has a built-in offset voltage (VOS) indicated at 104. While built-in offset voltage 104 is illustrated as a voltage source for simplicity, built-in offset voltage 104 may be due to temperature dependent Vt variations within operational amplifier 102 and/or first transistor 108. In addition, while programmable offset voltage 106 is illustrated as a programmable voltage source for simplicity, programmable offset voltage 106 may be internal to operational amplifier 102 (e.g., adjustable input pairs for the main differential amplifier of operational amplifier 102).

During an operating mode, the non-inverting input of operational amplifier 102 is electrically coupled to a reference voltage (VREF) node 101 and the positive terminal of the programmable offset voltage 106. The inverting input of operational amplifier 102 is electrically coupled to the positive terminal of the built-in offset voltage 104 through signal path 105. The negative terminal of the built-in offset voltage 104 is electrically coupled to the negative terminal of the programmable offset voltage 106 through a regulated voltage (VINT) node 109. A control input of programmable offset voltage 106 is electrically coupled to a code signal node 107. The output of operational amplifier 102 is electrically coupled to the gate of first transistor 108 through a signal path 103. The source-drain path of first transistor 108 is electrically coupled between a supply voltage (VDD) node 116 and the regulated voltage node 109. The first current source 110 is electrically coupled between the regulated voltage node 109 and a common or ground node 118. Resistance 112 is electrically coupled between the regulated voltage node 109 and one side of capacitance 114. The other side of capacitance 114 is electrically coupled to common or ground node 118.

Resistance 112 and capacitance 114 may represent a load (e.g., a memory device). First transistor 108 supplies a current and a regulated voltage (VINT) to the load based on the bias current (IR) and the reference voltage (VREF). First transistor 108, first current source 110, resistance 112, and capacitance 114 may be referred to as a main driver 120. The built-in offset voltage 104 is due to a combination of systematic offsets and random offsets of regulator 100a. The systematic offsets may be reduced with proper design, such as a common centroid structure. Unpredictable random offsets, however, may still occur. The feedback to the inverting input of operational amplifier 102 adjusts the output of operational amplifier 102 applied to the gate of the first transistor 108 during the operating mode to minimize the difference between the non-inverting and inverting inputs of the operational amplifier 102. Thus, the built-in offset voltage 104 of regulator 100a is transferred to the regulated voltage node 109. Programmable offset voltage 106 is configured to cancel the built-in offset voltage 104 (e.g., the offset voltage between the reference voltage (VREF) and the regulated voltage (VINT)) of regulator 100a based on a code on code signal node 107.

Figure 1B:
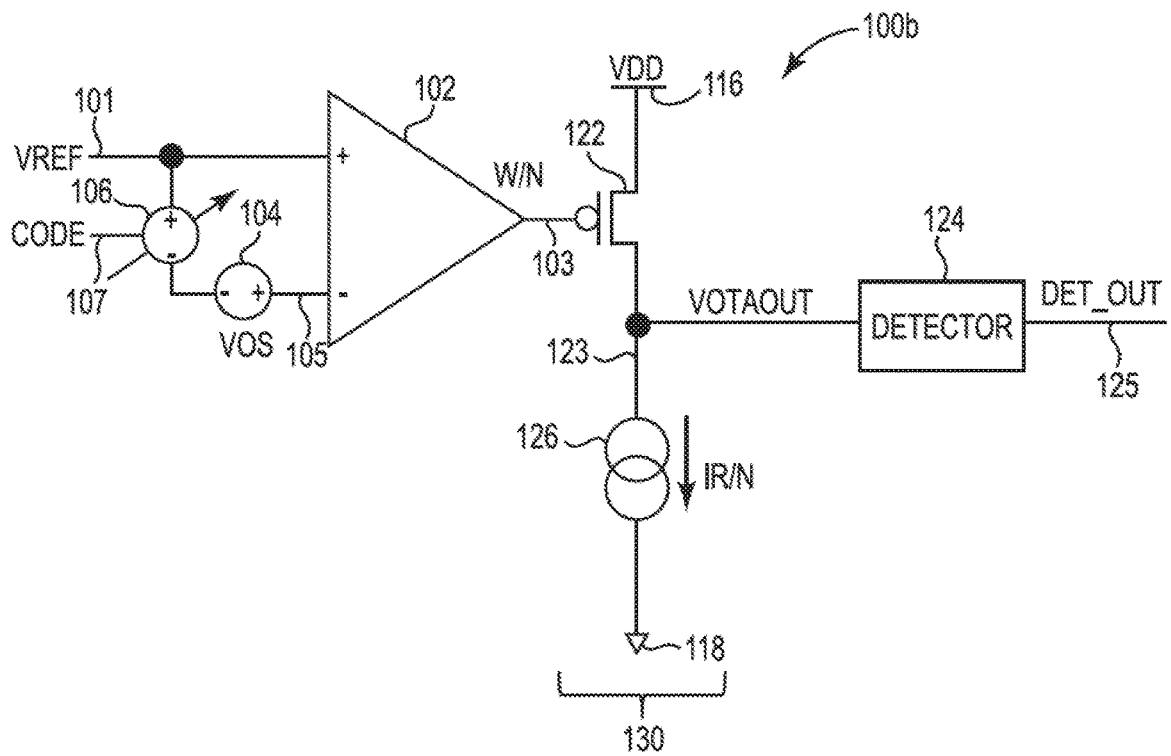
FIG. 1B is a schematic diagram illustrating one example of a voltage regulator and a detector during an offset cancellation calibration mode.

FIG. 1B is a schematic diagram illustrating one example of a voltage regulator 100b and a detector 124 during an offset cancellation calibration mode. Voltage regulator 100b may include operational amplifier 102, built-in offset voltage 104, programmable offset voltage 106, a second transistor (e.g., pFET) 122, and a second bias current (e.g., a second current source) 126. During an offset cancellation calibration mode, the non-inverting input of operational amplifier 102 is electrically coupled to the reference voltage (VREF) node 101 and the positive terminal of the programmable offset voltage 106. The inverting input of operational amplifier 102 is electrically coupled to the positive terminal of the built-in offset voltage 104 through signal path 105. The negative terminal of the built-in offset voltage 104 is electrically coupled to the negative terminal of the programmable offset voltage 106. A control input of programmable offset voltage 106 is electrically coupled to the code signal node 107. The output of operational amplifier 102 is electrically coupled to the gate of second transistor 122 through signal path 103. The source-drain path of second transistor 122 is electrically coupled between the supply voltage (VDD) node 116 and an offset voltage sensing (VOTAOUT) node 123. Detector 124 is electrically coupled between the offset voltage sensing node 123 and a detector output (DET_OUT) signal node 125. Second current source 126 is electrically coupled between the offset voltage sensing node 123 and common or ground node 118.

Second transistor 122 and second current source 126 may be referred to as a replica path 130. During an offset cancellation calibration mode, the built-in offset voltage 104 may be sensed via replica path 130. Based on the sensed built-in offset voltage, a code may be generated and applied to programmable offset voltage 106 to cancel the sensed built-in offset voltage. The replica path 130 is a scaled down copy of the main driver 120 (FIG. 1A). To sense the built-in offset voltage, a common voltage (e.g., VREF) is applied to the non-inverting and inverting inputs of operational amplifier 102 after breaking the feedback path and converting the regulator into an open loop configuration. The replica path 130 is isolated from the main driver 120 and does not see the load. In the offset cancellation calibration mode, the replica path 130 has the same current density as the main driver 120 during the operating mode to mimic the output of regulator 100a. The replica path 130, however, is scaled to a smaller current (e.g., 1/N) of the main driver 120 to save area and to reduce the capacitive loading.

In one example, the replica path is scaled by setting the sizes of first transistor 108 and current source 110 of FIG. 1A and the sizes of second transistor 122 and second current source 126 of FIG. 1B. First transistor 108 may have a first width (W), and first current source 110 may have a first current IR. Second transistor 122 may have a second width (W/N), and second current source 126 may have a second current (IR/N). "N" may be any suitable value (e.g., 5), such that the width of second transistor 122 is a fraction of the width of first transistor 108 and the current of second current source 126 is a fraction of the current of first current source 110. In one example, the second transistor 122 has a second width less than 20 percent of the first width of the first transistor 108.

The output voltage (VOTAOUT) of replica path 130 is applied to the input of detector 124. Detector 124 converts VOTAOUT into a digital value and outputs the digital value on DET_OUT signal node 125. Detector 124 compares the voltage level of VOTAOUT supplied by the second transistor 122 to a target voltage to provide the DET_OUT signal. Detector 124 may be configured to output a bit indicating whether the voltage of the VATAOUT signal on the offset voltage sensing node 123 is above or below the target voltage.

Figure 2:
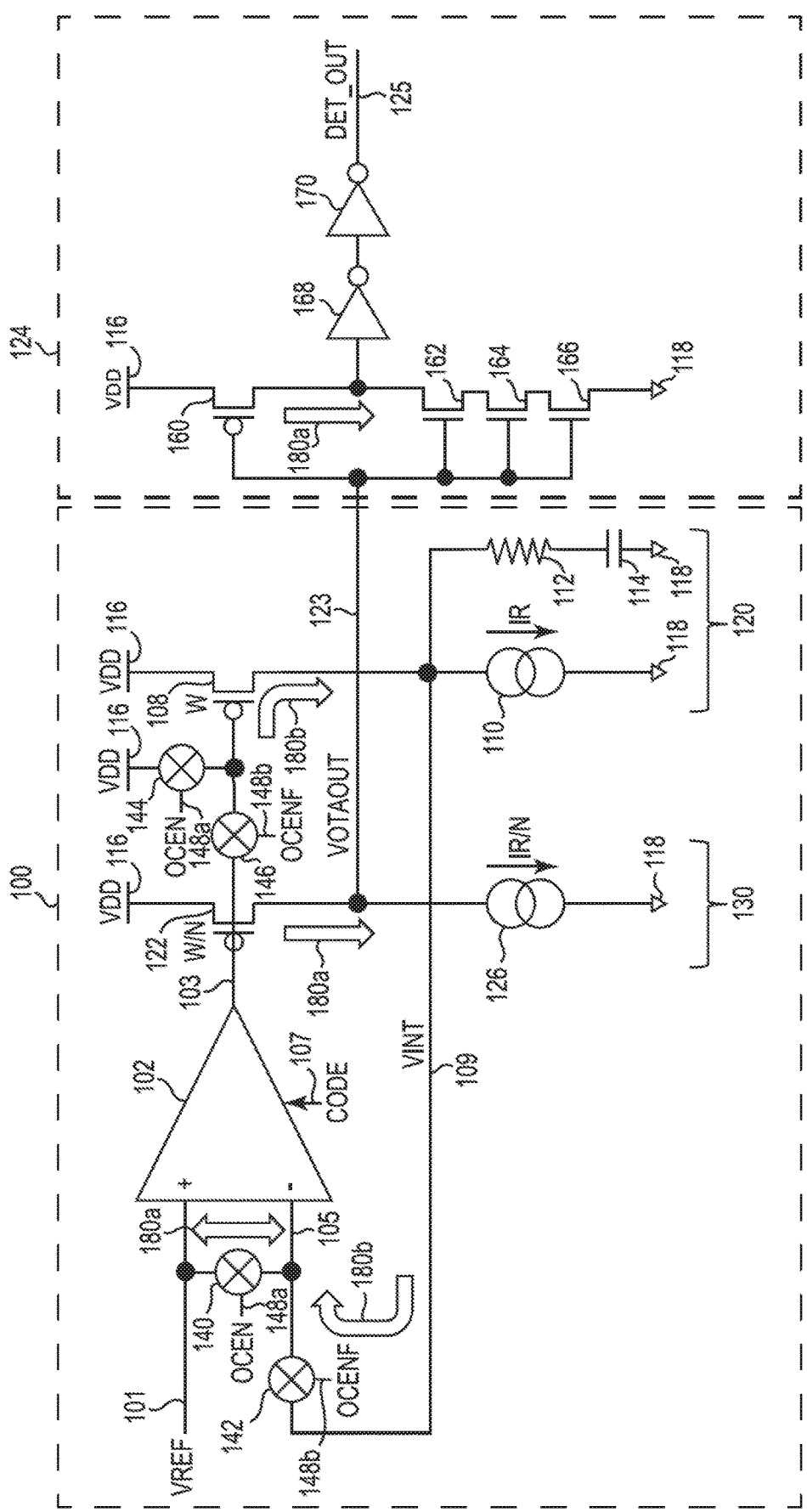
FIG. 2 is a schematic diagram illustrating one example of a voltage regulator and a detector for cancelling a random built-in offset voltage of the regulator.

FIG. 2 is a schematic diagram illustrating one example of a voltage regulator 100 and a detector 124 for cancelling a random built-in offset voltage of the regulator. Voltage regulator 100 may include operational amplifier 102, first transistor 108, first current source 110, resistance 112, capacitance 114, second transistor 122, and second current source 126 as previously described and illustrated with reference to FIGS. 1A and 1B. In addition, voltage regulator 100 may include a first switch 140, a second switch 142, a third switch 144, and a fourth switch 146. In this example, the built-in offset voltage is not shown and the programmable offset voltage is internal to operational amplifier 102.

First switch 140 is electrically coupled between the non-inverting input and the inverting input of operational amplifier 102. A control input of first switch 140 is electrically coupled to an offset cancellation calibration mode enable (OCEN) signal node 148a. Second switch 142 is electrically coupled between the inverting input of operational amplifier 102 and the regulated voltage (VINT) node 109. A control input of second switch 142 is electrically coupled to a complementary offset cancellation calibration mode enable (OCENF) signal node 148b, such that the OCENF signal is an inverted version of the OCEN signal. Third switch 144 is electrically coupled between the supply voltage node 116 and the gate of first transistor 108. A control input of third switch 144 is electrically coupled to the OCEN signal node 148a. Fourth switch 146 is electrically coupled between the output of operational amplifier 102 and the gate of first transistor 108. A control input of fourth switch 146 is electrically coupled to the OCENF signal node 148b.

Detector 124 may include a transistor (e.g., pFET) 160, transistors (e.g., nFETs) 162, 164, and 166, and inverters 168 and 170. The gate of each transistor 160, 162, 164, and 166 is electrically coupled to the offset voltage sensing node 123. The source-drain path of transistor 160 is electrically coupled between the voltage supply node 116 and the input of inverter 168. The source-drain path of transistor 162 is electrically coupled between the input of inverter 168 and one side of the source-drain path of transistor 164. The other side of the source-drain path of transistor 164 is electrically coupled to one side of the source-drain path of transistor 166. The other side of the source-drain path of transistor 166 is electrically coupled to common or ground node 118. The output of inverter 168 is electrically coupled to the input of the inverter 170. The output of the inverter 170 is electrically coupled to the detector output signal node 125.

In response to a first logic level (e.g., a logic high) of the OCEN signal on the OCEN signal node 148a, first switch 140 turns on to electrically connect the non-inverting input to the inverting input of operational amplifier 102 and third switch 144 turns on to electrically connect the supply voltage node 116 to the gate of the first transistor 108. In response to a second logic level (e.g., a logic low) of the OCEN signal, first switch 140 turns off to electrically disconnect the non-inverting input from the inverting input of operational amplifier 102 and third switch 144 turns off to electrically disconnect the supply voltage node 116 from the gate of the first transistor 108.

In response to a first logic level (e.g., a logic high) of the OCENF signal on the OCENF signal node 148b, second switch 142 turns on to electrically connect the inverting input of operational amplifier 102 to the regulated voltage node 109 and fourth switch 146 turns on to electrically connect the output of operational amplifier 102 to the gate of the first transistor 108. In response to a second logic level (e.g., a logic low) of the OCENF signal, second switch 142 turns off to electrically disconnect the inverting input of operational amplifier 102 from the regulated voltage node 109 and fourth switch 146 turns off to electrically disconnect the output of operational amplifier 102 from the gate of the first transistor 108.

Accordingly, switches 140 and 144 are turned on and switches 142 and 146 are turned off during an offset cancellation calibration mode of regulator 100, and switches 140 and 144 are turned off and switches 142 and 146 are turned on during an operating mode of regulator 100. Arrows 180a indicate the current path when the offset cancellation calibration mode is enabled, and arrows 180b indicate the current path when the operating mode is enabled.

Detector 124 may be configured as a common mode monitor. During the offset cancellation calibration mode, detector 124 converts the VOTAOUT signal to a digital value. In response to the voltage level of VOTAOUT exceeding a target voltage, detector 124 outputs a DET_OUT signal having a first logic level (e.g., a logic low) on detector output signal node 125. In response to the voltage level of VOTAOUT being below the target voltage, detector 124 outputs a DET_OUT signal having a second logic level (e.g., a logic high) on detector output signal node 125. Detector 124 is further described below with reference to FIG. 4.

Figure 3A:
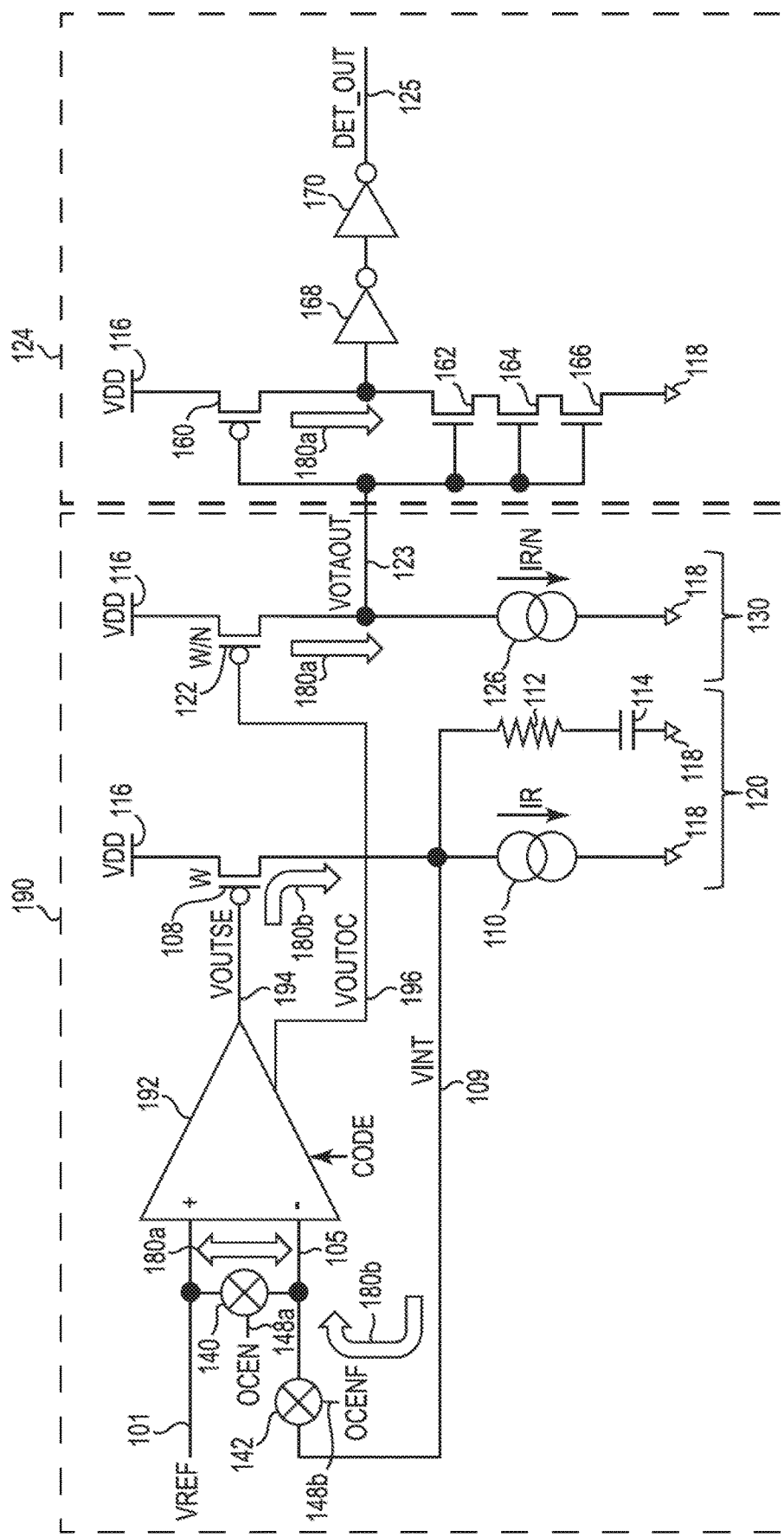
FIGS. 3A-3B are schematic diagrams illustrating another example of a voltage regulator and a detector for cancelling a random built-in offset voltage of the regulator.
Figure 3B:
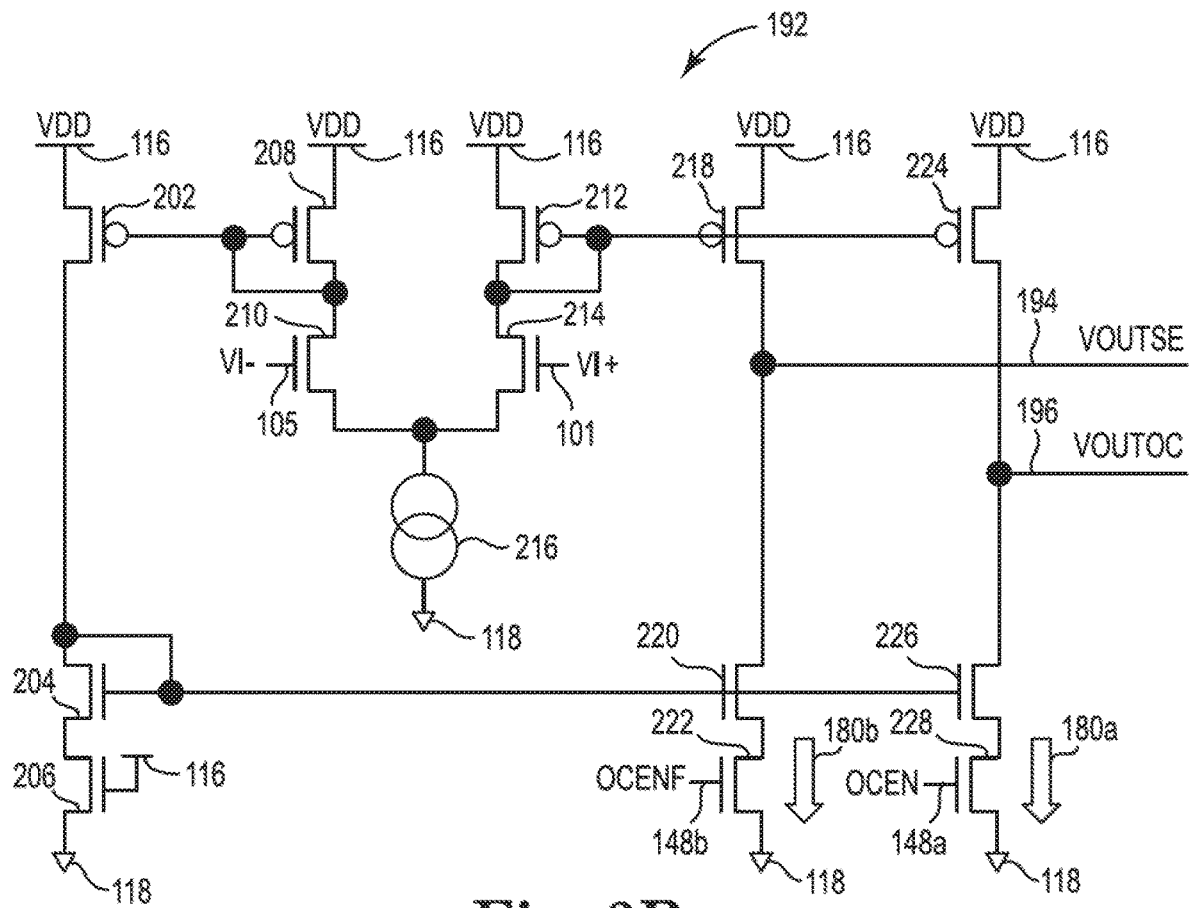

FIGS. 3A-3B are schematic diagrams illustrating another example of a voltage regulator 190 and a detector 124 for cancelling a random built-in offset voltage of the regulator. Voltage regulator 190 is similar to voltage regulator 100 previously described and illustrated with reference to FIG. 2, except that in voltage regulator 190 operational amplifier 102 is replaced with an operational amplifier 192 and switches 144 and 146 are excluded. In this example, a first output of operational amplifier 192 is electrically coupled to the gate of first transistor 108 through a voltage (VOUTSE) signal path 194. A second output of operational amplifier 192 is electrically coupled to the gate of second transistor 122 through a voltage (VOUTOC) signal path 196.

For simplicity, the programmable offset voltage 106 is not shown in FIG. 3B. As shown in FIG. 3B, operational amplifier 192 may include transistors (e.g., pFETs) 202, 208, 212, 218, and 224; transistors (e.g., nFETs) 204, 206, 210, 214, 220, 222, 226, and 228; and a current source 216. One side of the source-drain path of transistor 202 is electrically coupled to the supply voltage node 116. The other side of the source-drain path of transistor 202 is electrically coupled to one side of the source-drain path of transistor 204 and the gates of transistors 204, 220, and 226. The other side of the source-drain path of transistor 204 is electrically coupled to one side of the source-drain path of transistor 206. The other side of the source-drain path of transistor 206 is electrically coupled to common or ground node 118. The gate of transistor 206 is electrically coupled to the supply voltage node 116.

The gate of transistor 202 is electrically coupled to the gate of transistor 208 and one side of the source-drain paths of transistors 208 and 210. The other side of the source-drain path of transistor 208 is electrically coupled to the supply voltage node 116. The gate of transistor 210 is the inverting input (VI−) of operational amplifier 192 and is electrically coupled to signal path 105. The gate of transistor 212 is electrically coupled to the gates of transistor 218 and 224 and one side of the source-drain paths of transistors 212 and 214. The other side of the source-drain path of transistor 212 is electrically coupled to the supply voltage node 116. The gate of transistor 214 is the non-inverting input (VI+) of operational amplifier 192 and is electrically coupled to the reference voltage node 101. The other side of the source-drain paths of transistors 210 and 214 are electrically coupled to one side of current source 216. The other side of current source 216 is electrically coupled to common or ground node 118.

One side of the source-drain path of transistor 218 is electrically coupled to the supply voltage node 116. The other side of the source-drain path of transistor 218 is electrically coupled to one side of the source-drain path of transistor 220 through the VOUTSE signal path 194. The other side of the source-drain path of transistor 220 is electrically coupled to one side of the source-drain path of transistor 222. The gate of transistor 222 is electrically coupled to the OCENF signal node 148b. The other side of the source-drain path of transistor 222 is electrically coupled to common or ground node 118.

One side of the source-drain path of transistor 224 is electrically coupled to the supply voltage node 116. The other side of the source-drain path of transistor 224 is electrically coupled to one side of the source-drain path of transistor 226 through the VOUTOC signal path 196. The other side of the source-drain path of transistor 226 is electrically coupled to one side of the source-drain path of transistor 228. The gate of transistor 228 is electrically coupled to the OCEN signal node 148a. The other side of the source-drain path of transistor 228 is electrically coupled to common or ground node 118. Transistors 218, 220, and 222 may be matched to transistors 224, 226, and 228, respectively (e.g., have the same width, respectively).

In response to a first logic level (e.g., a logic high) of the OCEN signal and a second logic level (e.g., a logic low) of the OCENF signal, transistor 228 turns on and transistor 222 turns off to enable the offset cancellation calibration mode by outputting a voltage on VOUTOC signal path 196 for controlling second transistor 122 for supplying the VOTAOUT signal for sensing the built-in offset voltage of regulator 190. In response to a second logic level (e.g., a logic low) of the OCEN signal and a first logic level (e.g., a logic high) of the OCENF signal, transistor 228 turns off and transistor 222 turns on to enable the operating mode by outputting a voltage on VOUTSE signal path 194 for controlling first transistor 108 for supplying the regulated voltage (VINT) on regulated voltage node 109. Arrows 180a indicate the current path when the offset cancellation calibration mode is enabled, and arrows 180b indicate the current path when the operating mode is enabled.

Figure 4:
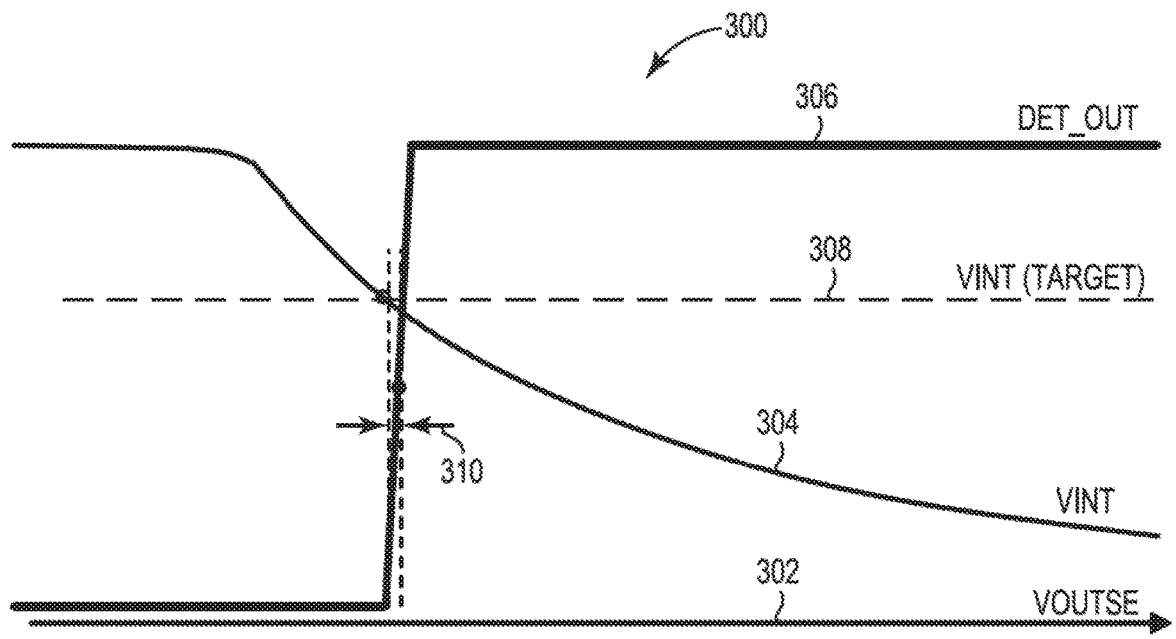
FIG. 4 is a chart depicting one example of detecting a random built-in offset voltage of a regulator.

FIG. 4 is a chart 300 depicting one example of detecting a random built-in offset voltage of a regulator. Chart 300 includes the voltage (VOUTSE) on signal path 103 of regulator 100 of FIG. 2 or on signal path 194 of regulator 190 of FIGS. 3A-3B on the x-axis as indicated at 302. Chart 300 also includes the regulated voltage (VINT) on the regulated voltage node 109 as indicated at 304, and the DET_OUT signal on the detector output signal node 125 as indicated at 306.

The characterization of the replica path 130 and the trip voltage of the detector 124 are configured to improve the accuracy of the detection and to ensure alignment with the operating mode. The voltage uncertainty, indicated at 310, is defined as the difference between VOUTSE causing the output of detector 124 to transition during the offset cancellation calibration mode and VOUTSE to reach the VINT target indicated at 308 during the operating mode. The uncertainty should be minimized. The intersection of VINT 304 and DET_OUT 306 corresponds to the value of VOUTSE 302 that causes the output of detector 124 to transition during the offset cancellation calibration mode while the intersection of VINT 304 and VINT target 308 corresponds to the value of VOUTSE producing the VINT target voltage during the operating mode.

Figure 5:
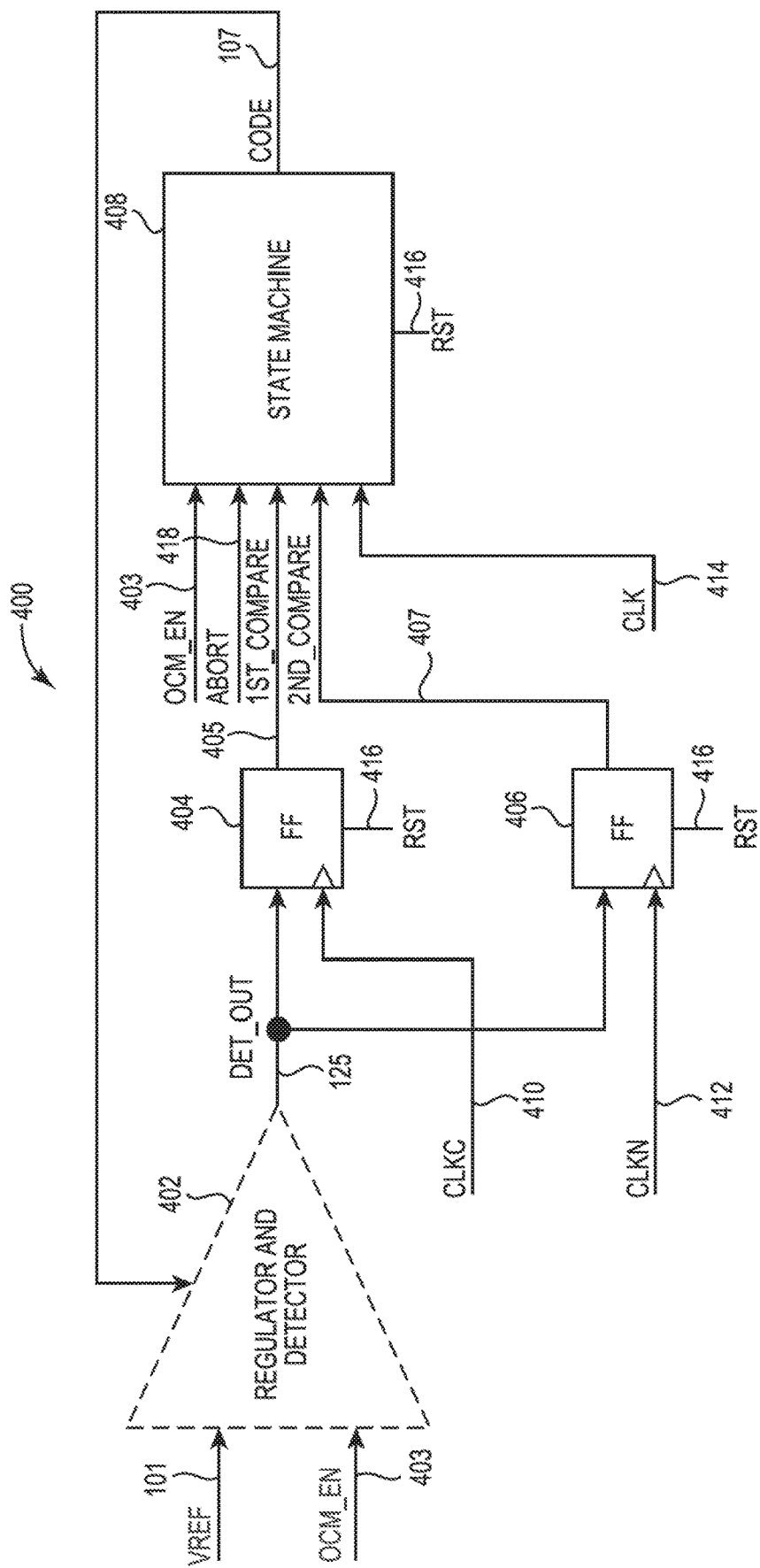
FIG. 5 is a schematic diagram illustrating one example of a system for cancelling a random built-in offset voltage of a regulator.

FIG. 5 is a schematic diagram illustrating one example of a system 400 for cancelling a random built-in offset voltage of a regulator. System 400 includes a circuit configured to set the code value on code signal node 107 based on a sensed built-in offset voltage of the regulator in response to an offset cancellation calibration mode enable signal. System 400 may include a regulator and detector 402, a first register (e.g., flip-flop) 404, a second register (e.g., flip-flop) 406, and a state machine 408. Regulator and detector 402 may include regulator 100 and detector 124 of FIG. 2 or regulator 190 and detector 124 of FIGS. 3A-3B. A first input of regulator and detector 402 is electrically coupled to the reference voltage node 101. A second input of regulator and detector 402 is electrically coupled to an offset cancellation calibration mode enable (OCM_EN) signal node 403. The OCM_EN signal may be used to generate the OCEN signal (e.g., directly) and the OCENF signal (e.g., by inverting the OCM_EN signal) of FIGS. 2-3B.

The output of regulator and detector 402 is electrically coupled to the data input of first register 404 and the data input of second register 406 through DET_OUT signal node 125. The clock input of first register 404 is electrically coupled to a first compare clock (CLKC) signal node 410. A reset input of first register 404 is electrically coupled to a reset (RST) signal node 416. The data output of first register 404 is electrically coupled to a first compare input of state machine 408 through a first compare (1ST_COMPARE) signal path 405. The clock input of second register 406 is electrically coupled to a second compare clock (CLKN) signal node 412. A reset input of second register 406 is electrically coupled to the reset (RST) signal node 416. The data output of second register 406 is electrically coupled to a second compare input of state machine 408 through a second compare (2ND_COMPARE) signal path 407. An enable input of state machine 408 is electrically coupled to the OCM_EN signal node 403. An abort input of state machine 408 is electrically coupled to an abort signal node 418. A clock input of state machine 408 is electrically coupled to an offset cancellation mode clock (CLK) signal node 414. A reset input of state machine 408 is electrically coupled to the reset (RST) signal node 416. The output of state machine 408 is electrically coupled to regulator and detector 402 through the code signal node 107.

Regulator and detector 402 operates as previously described above with reference to FIG. 2 or FIGS. 3A-3B. First register 404 stores (e.g., latches) the logic level (e.g., the bit value) of the DET_OUT signal in response to the CLKC signal and outputs the stored value on 1ST_COMPARE signal path 405. First register 404 may be reset in response to the RST signal. Second register 406 stores (e.g., latches) the logic level (e.g., the bit value) of the DET_OUT signal in response to the CLKN signal and outputs the stored value on 2ND_COMPARE signal path 407. Second register 406 may be reset in response to the RST signal. State machine 408 generates the code signal in response to the OCM_EN signal, the 1ST_COMPARE signal, the 2ND_COMPARE signal, and the CLK signal. In response to the abort signal, state machine 408 exits the offset cancellation calibration mode without changing states. State machine 408 may be reset to a default state in response to the RST signal. State machine 408 may be configured to generate the code to control the programmable offset voltage 106 based on the bit output by the detector 124 and stored during a first compare in register 404 and stored during a second compare in register 406.

Figure 6:
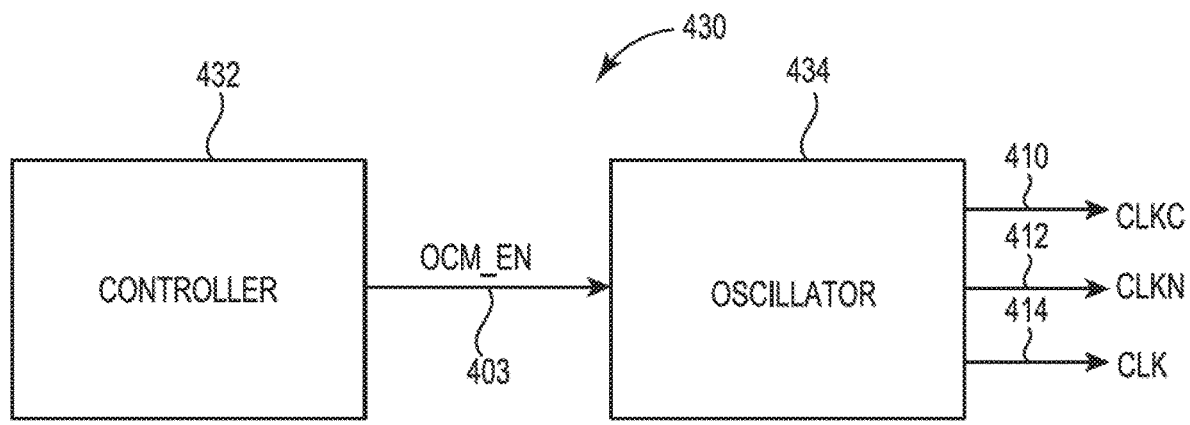
FIG. 6 is a block diagram illustrating one example of a circuit for generating clock signals for the system of FIG. 5.
Figure 7:
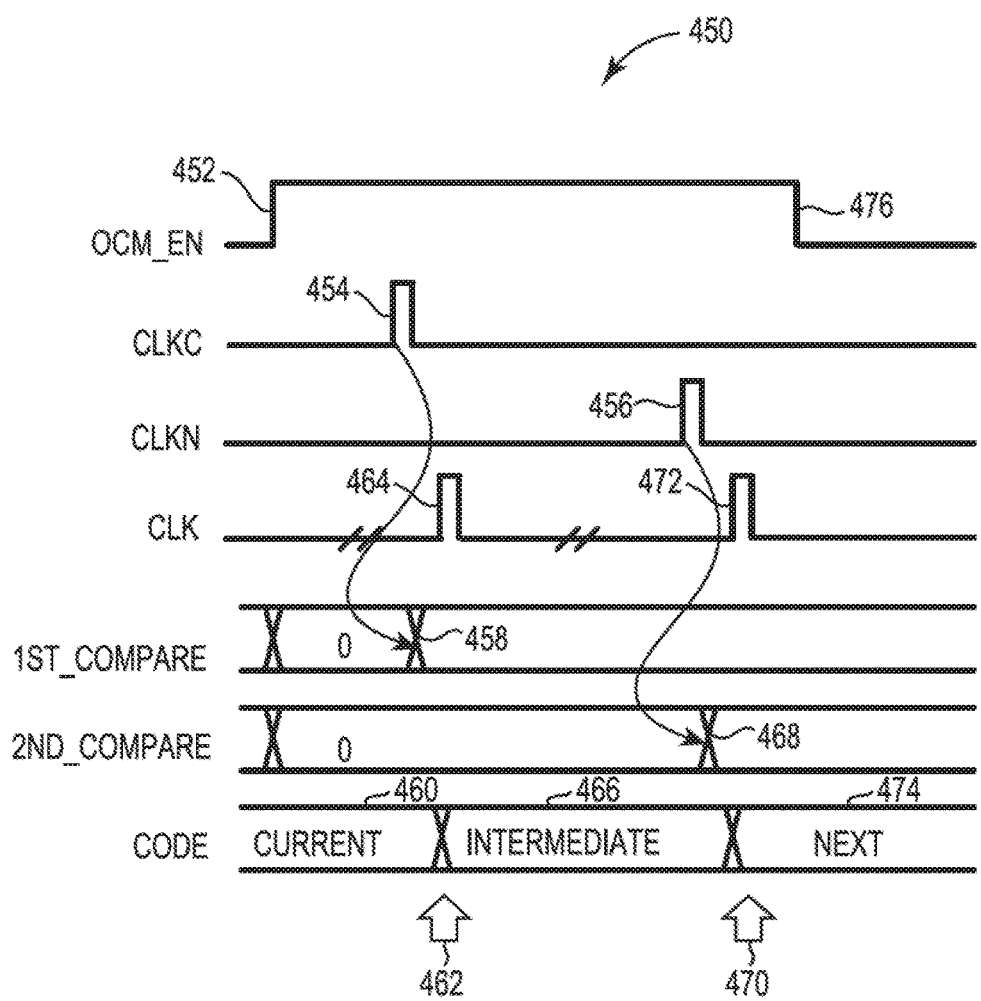
FIG. 7 is a timing diagram illustrating one example of setting a code for a programmable offset voltage during an offset cancellation calibration mode.

FIG. 6 is a block diagram illustrating one example of a circuit 430 for generating clock signals for the system of FIG. 5. Circuit 430 may include a controller 432 and an oscillator 434. An output of controller 432 is electrically coupled to an input of oscillator 434 through OCM_EN signal node 403. Outputs of oscillator 434 are electrically coupled to the CLKC signal node 410, the CLKN signal node 412, and the CLK signal node 414. Controller 432 may periodically generate the OCM_EN signal. Oscillator 434 generates the CLKC signal, the CLKN signal, and the CLK signal in response to the OCM_EN signal as shown in FIG. 7 and described below. Accordingly, controller 432 may be configured (e.g., by generating the OCM_EN signal) to connect the regulated voltage node 109 to the inverting input of the operational amplifier 102 or 192 during an operating mode of the regulator 100 or 190 and to disconnect the regulated voltage node 109 from the inverting input of the operational amplifier 102 or 109 during an offset cancellation calibration mode of the regulator 100 or 190. In addition, controller 432 may be configured (e.g., by generating the OCM_EN signal) to disconnect the non-inverting input from the inverting input of the operational amplifier 102 or 192 during the operating mode of the regulator 100 or 190 and to connect the non-inverting input to the inverting input of the operational amplifier 102 or 192 during the offset cancellation calibration mode of the regulator 100 or 190.

FIG. 7 is a timing diagram 450 illustrating one example of the operation of the offset cancellation calibration mode for system 400 of FIG. 5. Timing diagram 450 includes the OCM_EN signal on OCM_EN signal node 403, the CLKC signal on CLKC signal node 410, the CLKN signal on CLKN signal node 412, the CLK signal on CLK signal node 414, the 1ST_COMPARE signal on 1ST_COMPARE signal path 405, the 2ND_COMPARE signal on 2ND_COMPARE signal path 407, and the CODE signal on CODE signal node 107.

The offset cancellation calibration mode is enabled in response to the OCM_EN signal transitioning (e.g., from logic low to logic high) as indicated at 452. With the offset cancellation mode enabled, the output of the replica path 130 develops the VOTAOUT signal that depends on the polarity and magnitude of the built-in offset voltage. If the voltage of the VOTAOUT signal is below the trip voltage of the detector 124, the output of detector 124 transitions. In each offset cancellation calibration cycle defined by the OCM_EN signal, the CLKC signal and the CLKN signal are generated by oscillator 434 and are toggled in sequence as indicated at 454 and 456, respectively. The CLKC signal is used to perform the first compare as indicated at 458 by storing (e.g., latching) a first bit output from the detector 124 in the first register 404. The output of detector 124 may be based on the current code as indicated at 460 since the code may modify the voltage of the VOTAOUT signal (e.g., by adjusting the programmable offset voltage 106). At a first decision point as indicated at 462 in response to the CLK signal at 464, the state machine 408 generates an intermediate code as indicated at 466 based on the result of the first compare (e.g., the first bit stored in the first register 404). The state machine 408 may include an up and down counter that increments or decrements the counter based on the result of the first compare to generate the intermediate code. The code may change the offset voltage inside the regulator and thus the voltage of the VOTAOUT signal may be modified in preparation for the second compare.

The CLKN signal is used to perform the second compare as indicated at 468 by storing (e.g., latching) a second bit output from the detector 124 in the second register 406. The output of detector 124 may be based on the intermediate code as indicated at 466 since the code may modify the voltage of the VOTAOUT signal. At a second decision point as indicated at 470 in response to the CLK signal at 472, state machine 408 generates the next code as indicated at 474 based on the result of the second compare (e.g., the second bit stored in the second register 406) to finalize the code before disabling the offset cancellation calibration mode as indicated at 476.

The state machine 408 increments, decrements, or maintains the count of the up and down counter based on the first compare result and the second compare result. If the offset cancellation calibration mode is aborted via the abort signal during the offset cancellation calibration mode, the next state at 474 may be set to the current state at 460 regardless of the first and second compare results.

Table 1 below illustrates the relationship between the code (e.g., CODE<3:0>), the regulated voltage (VINT), and the detector output (DET_OUT). The code (e.g., four bits) for VINT to reach the target voltage may vary from die to die and with local Vt variation and temperature. The CODE=8 in Table 1 is the default target (T) in this example, such that the VINT at the CODE=8 is the closest to the target voltage. The voltage level of VINT moves lower as the code is increased and moves higher as the code is decreased. If the detector output observed in the first compare using the current code is high (e.g., "1"), the code should be decreased to increase the voltage level of VINT. If the detector output observed in the first compare is low (e.g., "0"), the code should be increased to decrease the voltage level of VINT. This is the first decision made by state machine 408, which generates the intermediate code.

TABLE 1

Relationship between the CODE, VINT, and DET_OUT

| CODE<3:0> | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| VINT | | | HIGHER ← | | | | | | T | | | → LOWER | | | | |
| DET_OUT | 0 | 0 | 0 | 0 | 0 | 0 | 0 | 0 | 0 | 1 | 1 | 1 | 1 | 1 | 1 | 1 |

The second decision is based on the intermediate code from the first decision. Thus, the second decision is based on the first compare and the second compare. The influence of the first compare and the second compare on the results are shown in Tables 2 and 3 below. The first decision is based upon the first compare result. The second decision is based upon the combination of the first compare result and the second compare result. As shown in Tables 2 and 3, the counter is either incremented by one, decremented by one, or stays at its current value in response to each cycle of the offset cancellation calibration mode (e.g., each cycle of the OCM_EN signal).

TABLE 2

First Decision

| Decision for Intermediate State w.r.t. Current State | Action | VINT w.r.t. TARGET |
|---|---|---|
| First Compare | 0 | INC | HIGHER |
| | 1 | DEC | LOWER |

TABLE 3

Second Decision

| Decision for Next State w.r.t. Intermediate State | Second Compare | |
|---|---|---|
| | 0 | 1 |
| First Compare | 0 | STAY | DEC |
| | 1 | STAY | STAY |

Figure 8A:
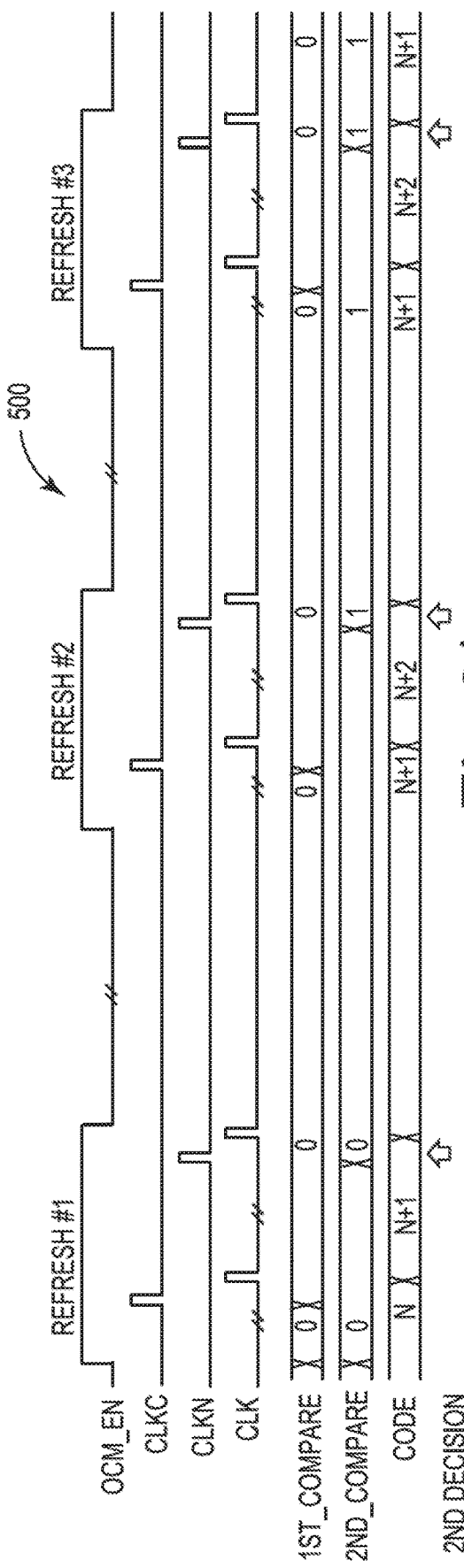
FIGS. 8A-8B are timing diagrams illustrating examples of setting a code for a programmable offset voltage during offset cancellation calibration mode sequences.

FIG. 8A is a timing diagram 500 corresponding to Table 4 below illustrating one example of an offset cancellation calibration mode sequence if the voltage level of VINT is too high relative to the target voltage. Timing diagram 500 includes the OCM_EN signal on OCM_EN signal node 403, the CLKC signal on CLKC signal node 410, the CLKN signal on CLKN signal node 412, the CLK signal on CLK signal node 414, the 1ST_COMPARE signal on 1ST_COMPARE signal path 405, the 2ND_COMPARE signal on 2ND_COMPARE signal path 407, the CODE signal on CODE signal node 107, and arrows indicating the second decision points.

TABLE 4

Counter State in an Offset Cancellation Calibration Mode Sequence if the Voltage Level of VINT is Too High Relative to the Target Voltage

| | Second Decision Point | | | | | Decision for Next State |
|---|---|---|---|---|---|---|
| Sequence | 1st Compare for Current State | 2nd Compare for Intermediate state | Current State | Intermediate State | Next State | w.r.t. Current State |
| Refresh#1 | 0 | 0 | N | N + 1 | N + 1 | INC |
| Refresh#2 | 0 | 1 | N + 1 | N + 2 | N + 1 | STAY |
| Refresh#3 | 0 | 1 | N + 1 | N + 2 | N + 1 | STAY |

Figure 8B:
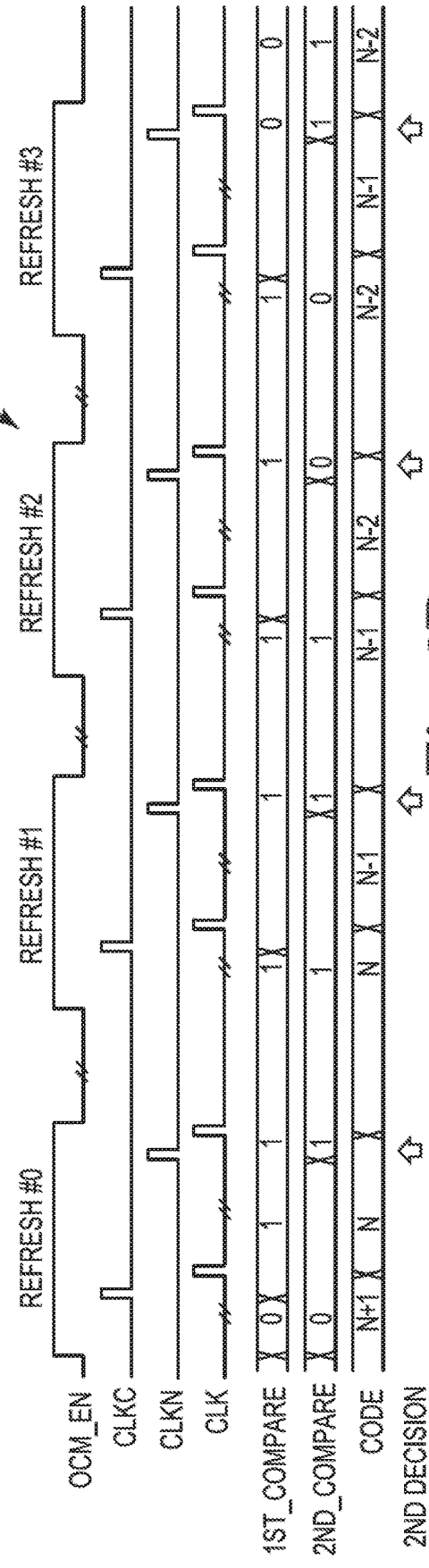

FIG. 8B is a timing diagram 550 corresponding to Table 5 below illustrating one example of the counter state in an offset cancellation calibration mode sequence if the voltage level of VINT is too low relative to the target voltage. Timing diagram 550 includes the OCM_EN signal on OCM_EN signal node 403, the CLKC signal on CLKC signal node 410, the CLKN signal on CLKN signal node 412, the CLK signal on CLK signal node 414, the 1ST_COMPARE signal on 1ST_COMPARE signal path 405, the 2ND_COMPARE signal on 2ND_COMPARE signal path 407, the CODE signal on CODE signal node 107, and arrows indicating the second decision points.

TABLE 5

Counter State in an Offset Cancellation Calibration Mode Sequence if the Voltage Level of VINT is Too Low Relative to the Target Voltage

| | Second Decision Point | | | | | Decision for Next State |
|---|---|---|---|---|---|---|
| Sequence | 1st Compare for Current State | 2nd Compare for Intermediate state | Current State | Intermediate State | Next State | w.r.t. Current State |
| Refresh#0 | 1 | 1 | N + 1 | N | N | DEC |
| Refresh#1 | 1 | 1 | N | N − 1 | N − 1 | DEC |
| Refresh#2 | 1 | 0 | N − 1 | N − 2 | N − 2 | DEC |
| Refresh#3 | 0 | 1 | N − 2 | N − 1 | N − 2 | STAY |

Upon power-up of a device, multiple OCM_EN signal cycles may be generated (e.g., by controller 432) to initially calibrate a regulator at least until the second decision of a cycle results in the counter staying at its current value. For example, for a four-bit code signal with the default code set at eight, up to eight OCM_EN signal cycles may be generated to account for a worst case calibration. After the initial offset cancellation calibration, one or multiple additional OCM_EN signal cycles may be periodically generated to ensure the voltage level of VINT is maintained at the target voltage.

Figure 9:
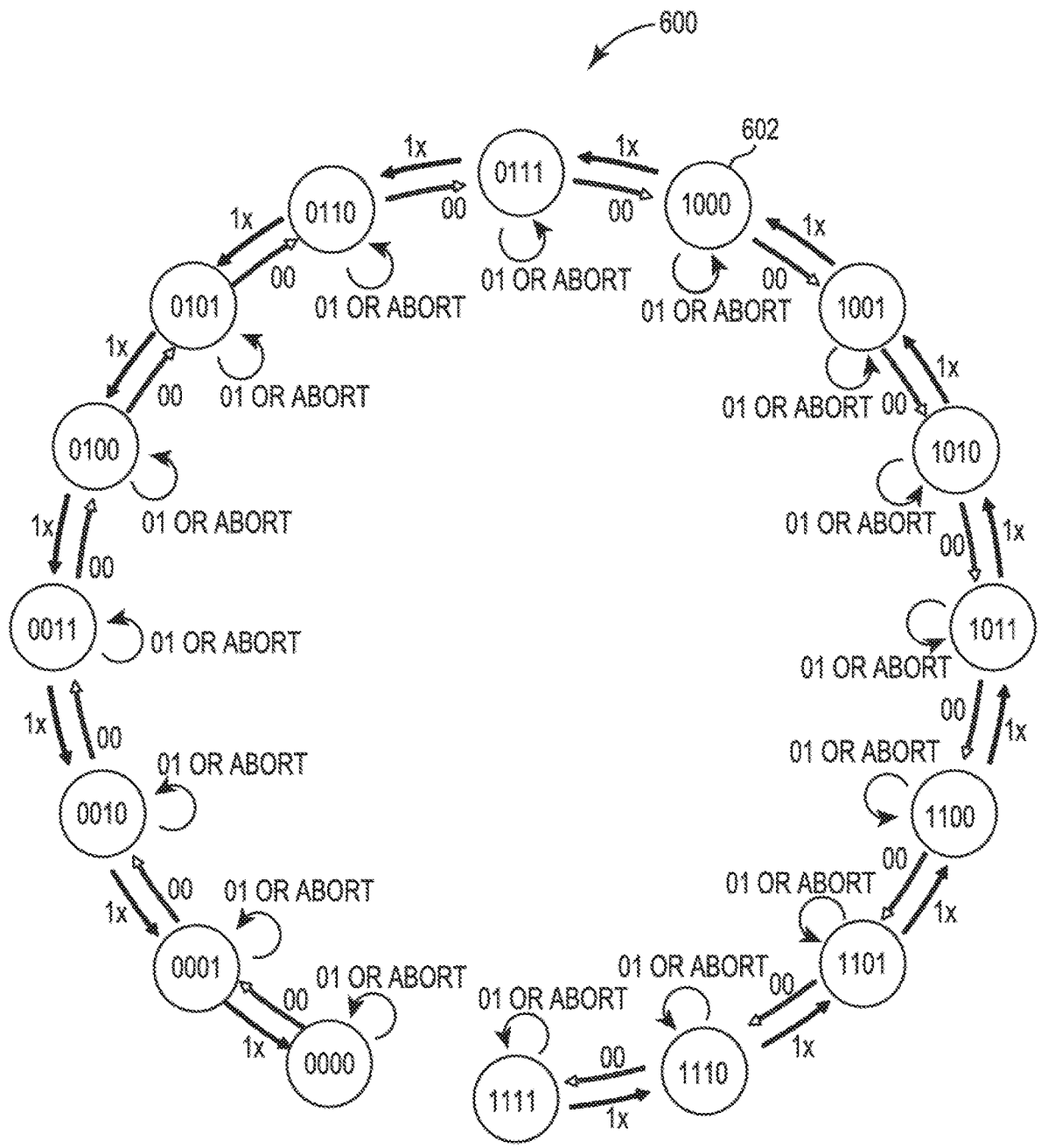
FIG. 9 is one example of a state diagram for the state machine of FIG. 5.

FIG. 9 is one example of a state diagram 600 for state machine 408 of FIG. 5. State 602 is the default or reset state indicating a counter value (e.g., code value) of eight ("1000"). State diagram 600 shows the decision for the next state with respect to the current state. The first bit of each two bit value "1x", "10", "00" indicates the first compare result and the second bit indicates the second compare result. The intermediate states are not shown in FIG. 9. If the first compare is "1", the counter decrements. If the first compare is "0" and the second compare is "1" or aborted by an interruption, the counter stays at its current value. If the first compare is "0" and the second compare is "0", the counter increments.

Figure 10A:
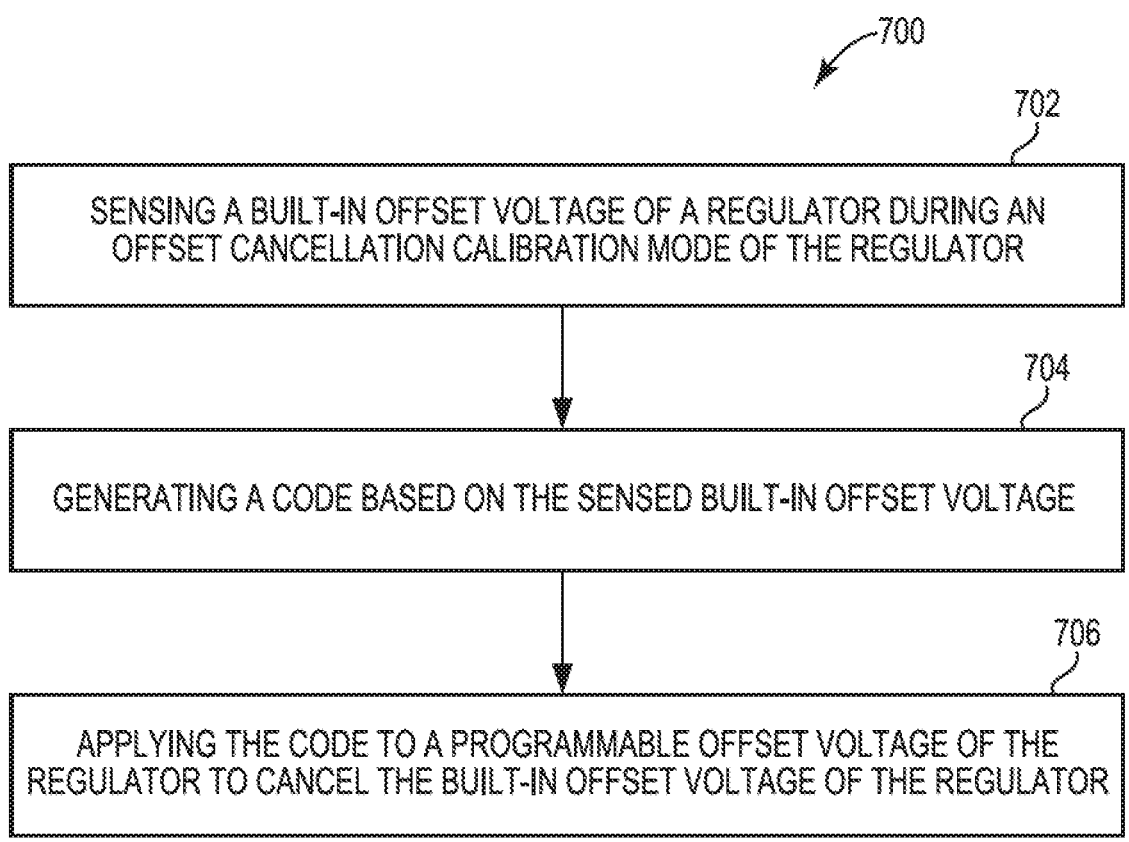
FIGS. 10A-10E are flow diagrams illustrating one example of a method for offset voltage cancellation in a regulator.

FIGS. 10A-10E are flow diagrams illustrating one example of a method 700 for offset voltage cancellation in a regulator. In one example, method 700 may be implemented by system 400 of FIG. 5. As illustrated in FIG. 10A, at 702 method 700 includes sensing a built-in offset voltage of a regulator during an offset cancellation calibration mode of the regulator. In one example, sensing the built-in offset voltage includes sensing whether an output voltage of the regulator during the offset cancellation calibration mode is above or below a target voltage. At 704, method 700 includes generating a code based on the sensed built-in offset voltage. In one example, generating the code includes incrementing a counter in response to the output voltage being below the target voltage and decrementing the counter in response to the output voltage being above the target voltage. At 706, method 700 includes applying the code to a programmable offset voltage of the regulator to cancel the built-in offset voltage of the regulator.

In another example, sensing the built-in offset voltage may include sensing whether an output voltage of the regulator during a first portion of the offset cancellation calibration mode is above or below a target voltage. In this case, generating the code includes incrementing a counter in response to the output voltage being below the target voltage and decrementing the counter in response to the output voltage being above the target voltage during the first portion of the offset cancellation calibration mode. Sensing the offset voltage further includes sensing whether the output voltage of the regulator during a second portion of the offset cancellation calibration mode is above or below the target voltage. Generating the code further includes maintaining the counter in response to the output voltage being below the target voltage during the second portion of the offset cancellation calibration mode, decrementing the counter in response to both the output voltage being above the target voltage during the second portion of the offset cancellation calibration mode and below the target voltage during the first portion of the offset cancellation calibration mode, and maintaining the counter in response to both the output voltage being above the target voltage during the second portion of the offset cancellation calibration mode and the output voltage being above the target voltage during the first portion of the offset cancellation calibration mode.

Figure 10B:
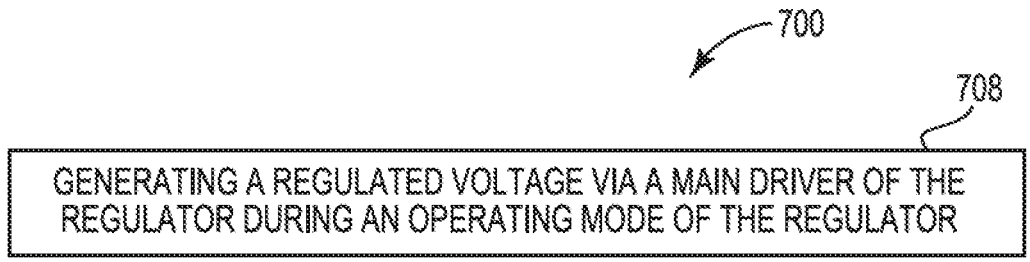

As illustrated in FIG. 10B, at 708 method 700 may further include generating a regulated voltage via a main driver of the regulator during an operating mode of the regulator. In this case, sensing the built-in offset voltage may include sensing the built-in offset voltage via a replica path of the regulator during the offset cancellation calibration mode of the regulator. The replica path and the main driver have the same current density and the replica path is scaled to a smaller current than the main driver.

Figure 10C:
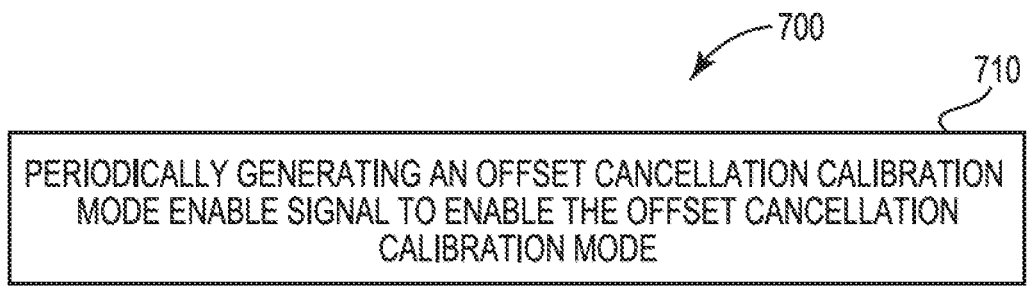
Figure 10D:
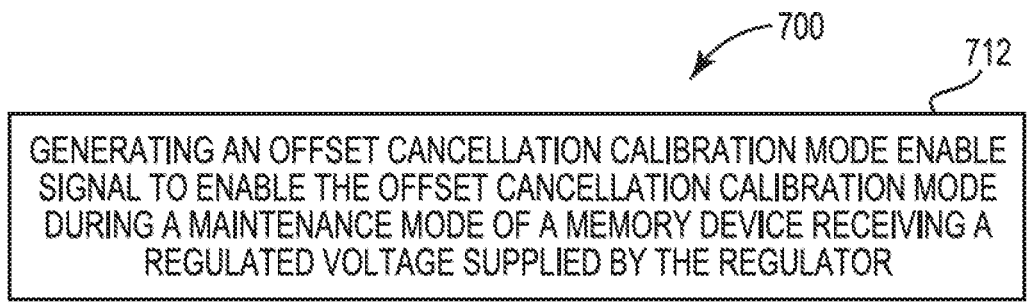
Figure 10E:
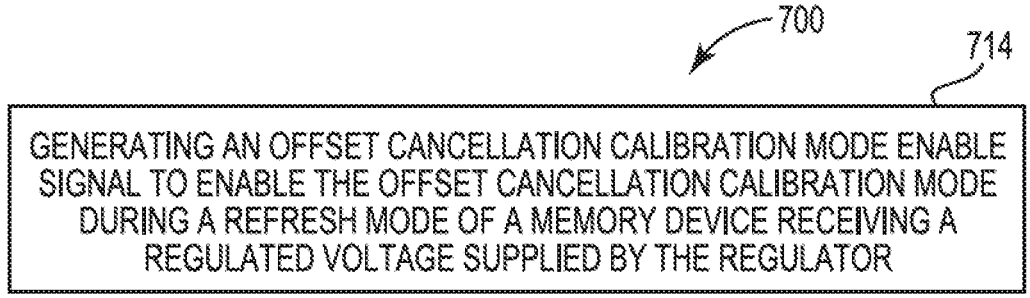

As illustrated in FIG. 10C, at 710 method 700 may further include periodically generating an offset cancellation calibration mode enable signal to enable the offset cancellation calibration mode. As illustrated in FIG. 10D, at 712 method 700 may further include generating an offset cancellation calibration mode enable signal to enable the offset cancellation calibration mode during a maintenance mode of a memory device receiving a regulated voltage supplied by the regulator. As illustrated in FIG. 10E, at 714 method 700 may further include generating an offset cancellation calibration mode enable signal to enable the offset cancellation calibration mode during a refresh mode of a memory device receiving a regulated voltage supplied by the regulator.

Figure 11:
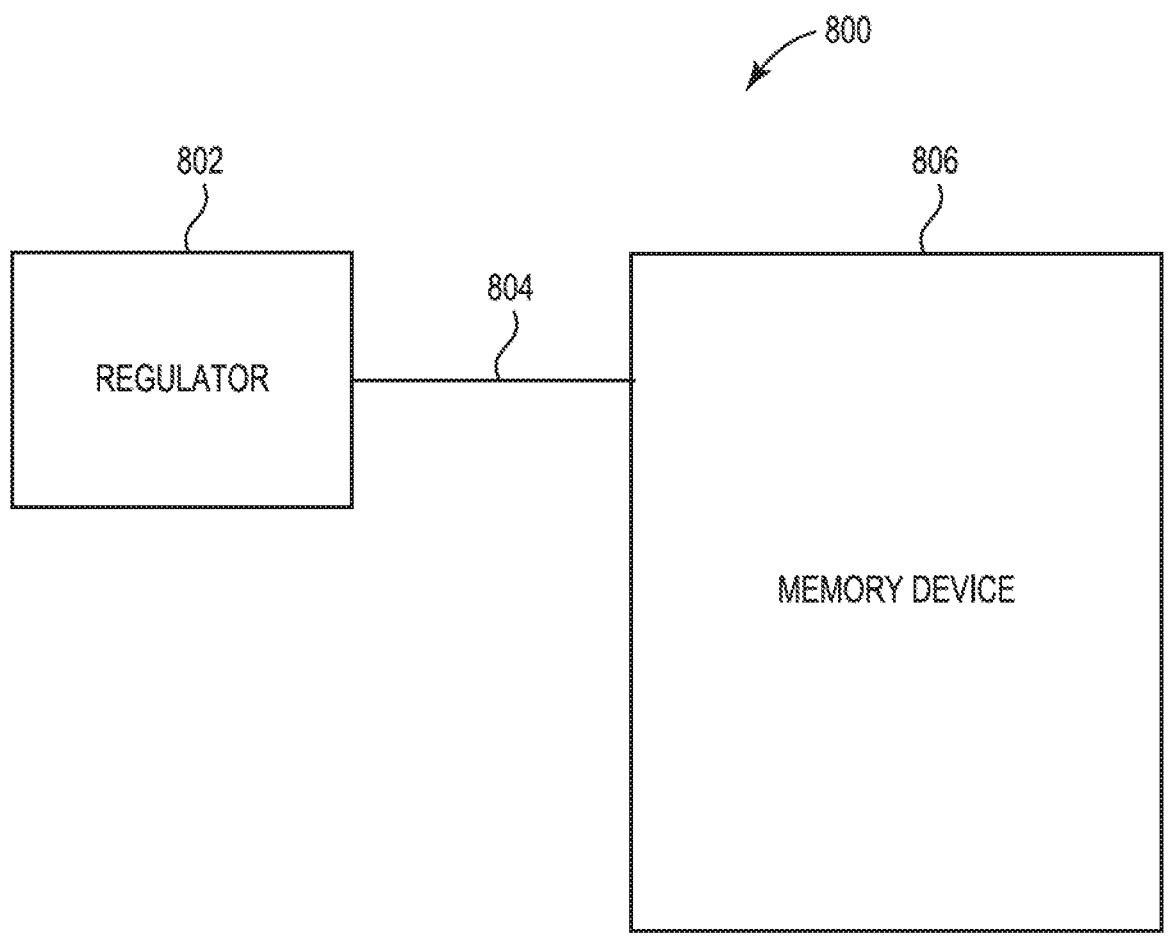
FIG. 11 is a block diagram illustrating one example of a memory system.

FIG. 11 is a block diagram illustrating one example of a memory system 800.

Memory system 800 includes a regulator 802 and a memory device 806. Regulator 802 is electrically coupled to memory device 806 through a signal path 804. In one example, regulator 802 includes system 400 of FIG. 5 to provide a regulated voltage with offset cancellation calibration to memory device 806. Memory device 806 may be a random-access memory (RAM), a read only memory (ROM), a dynamic random access memory (DRAM), a synchronous dynamic random access memory (SDRAM), a flash memory (e.g., NAND, NOR, etc.), or a ferroelectric random access memory (FeRAM). The offset cancellation calibration mode of regulator 802 may be enabled during a maintenance mode of memory device 806 (e.g., for a flash memory device), during a refresh mode of memory device 806 (e.g., for a DRAM memory device), or during another suitable period during which the memory device 806 is not being accessed for read and/or write operations.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A regulator comprising:
an operational amplifier comprising a non-inverting input, an inverting input, and an output;
a programmable offset voltage configured to cancel a built-in offset voltage of the regulator based on a code; and
a circuit configured to set the code based on a sensed built-in offset voltage of the regulator in response to an offset cancellation calibration mode enable signal,
wherein the programmable offset voltage is coupled between the non-inverting input and the inverting input during both an operating mode and an offset cancellation calibration mode of the regulator.

2. The regulator of claim 1, wherein the code comprises four bits.

3. The regulator of claim 1, wherein a polarity and a magnitude of the built-in offset voltage is random.

4. A regulator comprising:
an operational amplifier comprising a non-inverting input, an inverting input, and an output;
a programmable offset voltage configured to cancel a built-in offset voltage of the regulator based on a code;
a circuit configured to set the code based on a sensed built-in offset voltage of the regulator in response to an offset cancellation calibration mode enable signal;
a first switch to directly connect the non-inverting input to the inverting input of the operational amplifier in response to the offset cancellation calibration mode enable signal; and
a second switch to disconnect the inverting input of the operational amplifier from a feedback path of the regulator in response to the offset cancellation calibration mode enable signal.

5. The regulator of claim 4, further comprising:
a first transistor to supply a regulated voltage to a load;
a third switch to connect a voltage supply to a gate of the first transistor in response to the offset cancellation calibration mode enable signal; and
a fourth switch to disconnect the output of the operational amplifier from the gate of the first transistor in response to the offset cancellation calibration mode enable signal.

6. The regulator of claim 4, further comprising:
a first transistor having a gate electrically coupled to the output of the operational amplifier, the first transistor to supply a regulated voltage to a load;
a second transistor having a gate electrically coupled to the output of the operational amplifier, the second transistor to supply a voltage to the circuit;
a third switch to disable the first transistor in response to the offset cancellation calibration mode enable signal; and
a fourth switch to enable the second transistor in response to the offset cancellation calibration mode enable signal.

7. The regulator of claim 4, further comprising:
a first transistor electrically coupled to the output of the operational amplifier to supply a regulated voltage to a load, the first transistor having a first width; and
a second transistor electrically coupled to the output of the operational amplifier to supply a voltage to the circuit, the second transistor having a second width less than 20 percent of the first width.

8. The regulator of claim 7, wherein the circuit comprises:
a detector electrically coupled to the second transistor to compare the voltage supplied by the second transistor to a target voltage; and
a state machine to set the code based on the comparison.

9. A regulator comprising:
an operational amplifier comprising a non-inverting input, an inverting input, and a first output;
a reference voltage node to provide a reference voltage to the non-inverting input of the operational amplifier;
a regulated voltage node to supply a regulated voltage to a load based on the reference voltage; and
a programmable offset voltage controlled to cancel a built-in offset voltage between the reference voltage and the regulated voltage,
wherein the programmable offset voltage is coupled between the non-inverting input and the inverting input during both an operating mode and an offset cancellation calibration mode of the regulator.

10. A regulator comprising:
an operational amplifier comprising a non-inverting input, an inverting input, and a first output;
a reference voltage node to provide a reference voltage to the non-inverting input of the operational amplifier;
a regulated voltage node to supply a regulated voltage to a load based on the reference voltage;
a programmable offset voltage controlled to cancel a built-in offset voltage between the reference voltage and the regulated voltage;
a first transistor electrically coupled to the first output of the operational amplifier and the regulated voltage node;
a first current source electrically coupled to the regulated voltage node; and
a controller configured to connect the regulated voltage node to the inverting input of the operational amplifier during an operating mode of the regulator and to disconnect the regulated voltage node from the inverting input of the operating amplifier during an offset cancellation calibration mode of the regulator.

11. A regulator comprising:
an operational amplifier comprising a non-inverting input, an inverting input, and a first output;
a reference voltage node to provide a reference voltage to the non-inverting input of the operational amplifier;
a regulated voltage node to supply a regulated voltage to a load based on the reference voltage;
a programmable offset voltage controlled to cancel a built-in offset voltage between the reference voltage and the regulated voltage;
a first transistor electrically coupled to the first output of the operational amplifier and the regulated voltage node;
a first current source electrically coupled to the regulated voltage node;
a controller configured to connect the regulated voltage node to the inverting input of the operational amplifier during an operating mode of the regulator and to disconnect the regulated voltage node from the inverting input of the operating amplifier during an offset cancellation calibration mode of the regulator;
an offset voltage sensing node;
a second transistor electrically coupled to the first output of the operational amplifier and the offset voltage sensing node; and
a second current source electrically coupled to the offset voltage sensing node,
wherein the controller is configured to disconnect the non-inverting input from the inverting input of the operational amplifier during the operating mode of the regulator and to connect the non-inverting input to the inverting input of the operational amplifier during the offset cancellation calibration mode of the regulator.

12. The regulator of claim 11, further comprising:
a detector electrically coupled to the offset voltage sensing node, the detector configured to output a bit indicating whether a voltage on the offset voltage sensing node is above or below a target voltage.

13. The regulator of claim 12, further comprising:
a state machine electrically coupled to the detector, the state machine configured to generate a code to control the programmable offset voltage based on the bit output by the detector.

14. The regulator of claim 13, further comprising:
an oscillator to generate a first compare clock signal, a second compare clock signal, and an offset cancellation mode clock signal in response to an offset cancellation calibration mode enable signal;
a first register to store a first bit output from the detector in response to the first compare clock signal; and
a second register to store a second bit output from the detector in response to the second compare clock signal,
wherein, in response to the offset cancellation mode clock signal, a counter of the state machine is incremented, decremented, or maintained at its current value to generate the code based on the first bit stored in the first register and the second bit stored in the second register.

15. A regulator comprising:
an operational amplifier comprising a non-inverting input, an inverting input, and a first output;
a reference voltage node to provide a reference voltage to the non-inverting input of the operational amplifier;
a regulated voltage node to supply a regulated voltage to a load based on the reference voltage;
a programmable offset voltage controlled to cancel a built-in offset voltage between the reference voltage and the regulated voltage; and
an offset voltage sensing node;
wherein the operational amplifier further comprises a second output, the first output electrically coupled to a first transistor to supply the regulated voltage on the regulated voltage node and the second output electrically coupled to a second transistor to supply a voltage on the offset voltage sensing node for sensing the built-in offset voltage between the reference voltage and the regulated voltage.

16. A method for offset voltage cancellation in a regulator, the method comprising:
sensing a built-in offset voltage of the regulator during an offset cancellation calibration mode of the regulator;
generating a code based on the sensed built-in offset voltage; and
applying the code to a programmable offset voltage coupled between a non-inverting input and an inverting input of an operational amplifier of the regulator during an operating mode of the regulator to cancel the built-in offset voltage of the regulator.

17. The method of claim 16, further comprising:
generating a regulated voltage via a main driver of the regulator during an operating mode of the regulator,
wherein sensing the built-in offset voltage comprises sensing the built-in offset voltage via a replica path of the regulator during the offset cancellation calibration mode of the regulator, the replica path and the main driver comprising the same current density, and the replica path scaled to a smaller current than the main driver.

18. The method of claim 16,
wherein sensing the built-in offset voltage comprises sensing whether an output voltage of the regulator during the offset cancellation calibration mode is above or below a target voltage, and
wherein generating the code comprises incrementing a counter in response to the output voltage being below the target voltage and decrementing the counter in response to the output voltage being above the target voltage.

19. The method of claim 16, further comprising:
periodically generating an offset cancellation calibration mode enable signal to enable the offset cancellation calibration mode.

20. The method of claim 16, further comprising:
generating an offset cancellation calibration mode enable signal to enable the offset cancellation calibration mode during a maintenance mode of a memory device receiving a regulated voltage supplied by the regulator.

21. The method of claim 16, further comprising:
generating an offset cancellation calibration mode enable signal to enable the offset cancellation calibration mode during a refresh mode of a memory device receiving a regulated voltage supplied by the regulator.

22. A method for offset voltage cancellation in a regulator, the method comprising:
sensing a built-in offset voltage of a regulator during an offset cancellation calibration mode of the regulator;
generating a code based on the sensed built-in offset voltage; and
applying the code to a programmable offset voltage of the regulator to cancel the built-in offset voltage of the regulator,
wherein sensing the built-in offset voltage comprises sensing whether an output voltage of the regulator during a first portion of the offset cancellation calibration mode is above or below a target voltage,
wherein generating the code comprises incrementing a counter in response to the output voltage being below the target voltage and decrementing the counter in response to the output voltage being above the target voltage during the first portion of the offset cancellation calibration mode,
wherein sensing the offset voltage further comprises sensing whether the output voltage of the regulator during a second portion of the offset cancellation calibration mode is above or below the target voltage, and
wherein generating the code further comprises maintaining the counter in response to the output voltage being below the target voltage during the second portion of the offset cancellation calibration mode, decrementing the counter in response to both the output voltage being above the target voltage during the second portion of the offset cancellation calibration mode and below the target voltage during the first portion of the offset cancellation calibration mode, and maintaining the counter in response to both the output voltage being above the target voltage during the second portion of the offset cancellation calibration mode and the output voltage being above the target voltage during the first portion of the offset cancellation calibration mode.

* * * * *